(12) United States Patent
Remington

(10) Patent No.: US 7,655,274 B2
(45) Date of Patent: Feb. 2, 2010

(54) COMBUSTION DEPOSITION USING AQUEOUS PRECURSOR SOLUTIONS TO DEPOSIT TITANIUM DIOXIDE COATINGS

(75) Inventor: Michael P. Remington, Toledo, OH (US)

(73) Assignee: Guardian Industries Corp., Auburn Hills, MI (US)

( * ) Notice: Subject to any disclaimer, the term of this patent is extended or adjusted under 35 U.S.C. 154(b) by 4 days.

(21) Appl. No.: 11/979,543

(22) Filed: Nov. 5, 2007

(65) Prior Publication Data

US 2009/0117273 A1 May 7, 2009

(51) Int. Cl.
*C23C 16/00* (2006.01)
(52) U.S. Cl. .................................. 427/248.1
(58) Field of Classification Search .......... None
See application file for complete search history.

(56) References Cited

U.S. PATENT DOCUMENTS

| | | | |
|---|---|---|---|
| 5,652,021 A | 7/1997 | Hunt et al. | |
| 5,858,465 A | 1/1999 | Hunt et al. | |
| 6,013,318 A | 1/2000 | Hunt et al. | |
| 6,169,119 B1 * | 1/2001 | Ryang et al. | 516/90 |
| 6,193,911 B1 * | 2/2001 | Hunt et al. | 252/518.1 |
| 2001/0054455 A1 * | 12/2001 | Shimakura et al. | 148/320 |
| 2006/0048943 A1 * | 3/2006 | Parker et al. | 166/308.1 |
| 2007/0113881 A1 * | 5/2007 | Mellott et al. | 136/243 |

FOREIGN PATENT DOCUMENTS

DE   102 06 330   8/2003

OTHER PUBLICATIONS

"Combustion Chemical Vapor Deposition: A Novel Thin-Film Deposition Technique", Hunt et al., 1993 American Institute of Physics, Apr. 21, 1993.
"Growth of Thin Films of Molybdenum and Tungsten Oxides by Combustion CVD using Aqueous Precursor Solutions", Davis et al., Chemical Vapor Deposition 2004, 10, No. 1, pp. 29-34.
"Generation of Unagglomerated, Dense, BaTiO3 Particles by Flame—Spray Pyrolysis", Brewster et al., Ceramics Processing 1997, Aiche Journal, vol. 43, No. 11A, pp. 2665-2669.
"Flame Aerosol Synthesis of Smart Nanostructured Materials", Strobel et al., The Royal Society of Chemistry 2007, pp. 4743-4756.
"Ceramic Powder Synthesis by Spray Pyrolysis", Messing et al., Journal of the American Ceramic Society, vol. 76, No. 11, Nov. 1, 1993.

* cited by examiner

*Primary Examiner*—Roberts Culbert
(74) *Attorney, Agent, or Firm*—Nixon & Vanderhye P.C.

(57) ABSTRACT

Certain example embodiments of this invention relate to the deposition of coatings onto substrates via combustion deposition. An aqueous precursor solution is used in connection with combustion deposition for the deposition of coatings onto a substrate. In certain example embodiments, the aqueous precursor solution may be an organic salt (e.g., of titanium, such as titanium (IV) bis(ammonium lactate)dihydroxide (aq)), an oxalic acid salts of titanium (e.g., potassium titanyl oxalate (e.g., $K_2TiO(C_2O_4)_2 \cdot 2\,H_2O$ or other suitable stoichiometry) and $Ti_2(C_2O_4)_3 \cdot 10\,H_2O$), a water soluble salts of titanium acetate and titanium citrate, etc., which may enable a titanium oxide (e.g., $TiO_2$ or other suitable stoichiometry) coating to be deposited onto a glass substrate. The deposited $TiO_2$ coating may be of high refractive index and may possess photocatalytic and/or super-hydrophilic properties. Thus, certain example embodiments advantageously may be used for the inexpensive, easy to handle, and environmentally friendly production of, for example, multilayer AR (MLAR) designs and low maintenance glass applications.

26 Claims, 4 Drawing Sheets

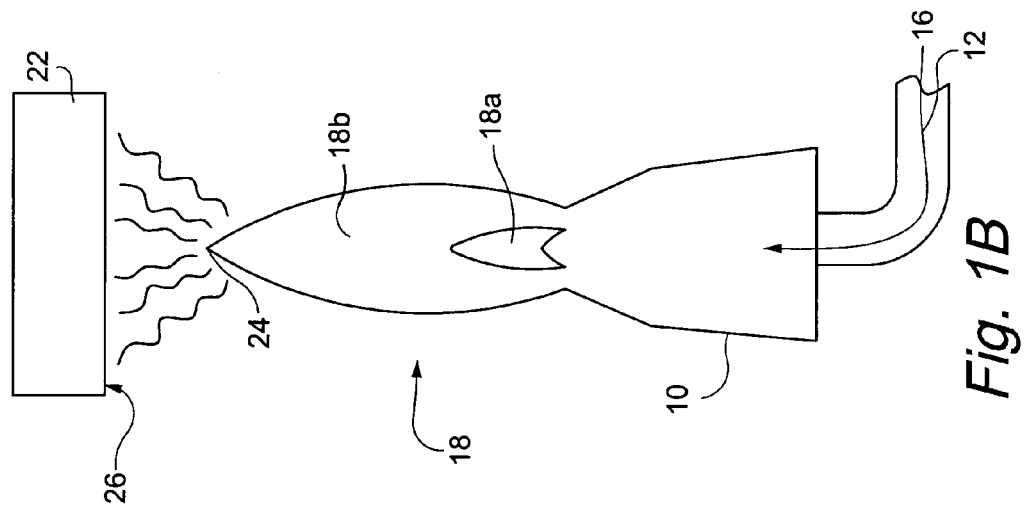
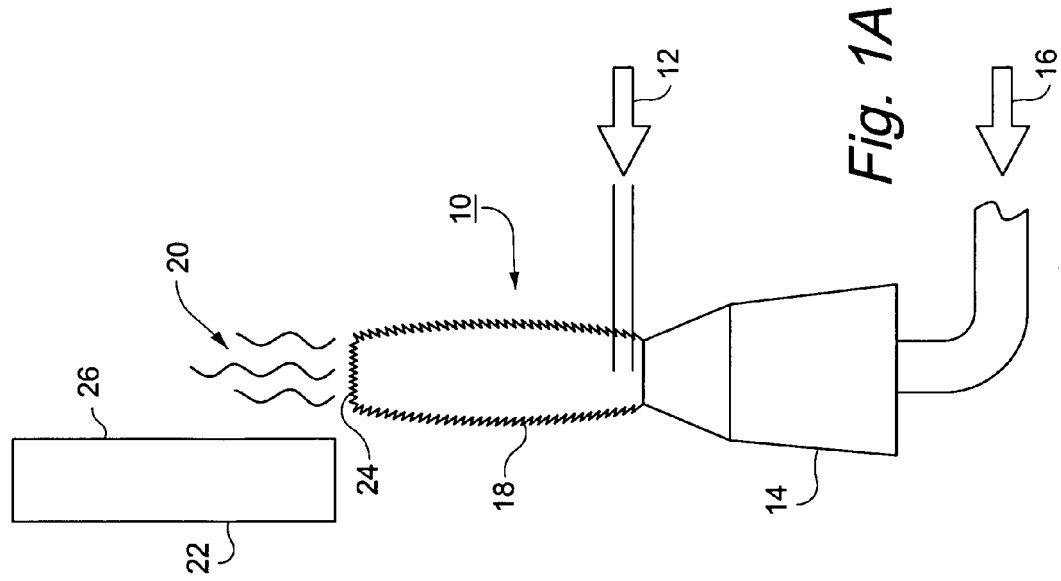

US 7,655,274 B2

COMBUSTION DEPOSITION USING AQUEOUS PRECURSOR SOLUTIONS TO DEPOSIT TITANIUM DIOXIDE COATINGS

FIELD OF THE INVENTION

Certain example embodiments of this invention relate to the deposition of coatings onto substrates via combustion deposition and, more particularly, to an aqueous precursor solution be used in connection with combustion deposition for the deposition of coatings onto a substrate. In certain example embodiments, the aqueous precursor solution may be an organic salt (e.g., of titanium, such as titanium (IV) bis(ammonium lactate)dihydroxide (aq)), an oxalic acid salts of titanium (e.g., potassium titanyl oxalate (e.g., $K_2TiO(C_2O_4)_2 \cdot 2\ H_2O$ or other suitable stoichiometry) and $Ti_2(C_2O_4)_3 \cdot 10\ H_2O$), a water soluble salt of titanium acetate and titanium citrate, etc., which may enable a titanium dioxide (e.g., $TiO_2$ or other suitable stoichiometry) coating to be deposited onto a substrate (e.g., a glass substrate).

BACKGROUND AND SUMMARY OF EXAMPLE EMBODIMENTS OF THE INVENTION

Combustion chemical vapor deposition (combustion CVD) is a relatively new technique for the growth of coatings. Combustion CVD is described, for example, in U.S. Pat. Nos. 5,652,021; 5,858,465; and 6,013,318, each of which is hereby incorporated herein by reference in its entirety.

Conventionally, in combustion CVD, precursors are dissolved in a flammable solvent and the solution is delivered to the burner where it is ignited to give a flame. A substrate is then passed under the flame to deposit a coating.

There are several advantages of combustion CVD over traditional pyrolytic deposition techniques (such as CVD, spray and sol-gel, etc.). One advantage is that the energy required for the deposition is provided by the flame. Thus, combustion CVD is amenable to comparatively low substrate temperatures and non-traditional substrates (e.g., plastics, etc.). Another advantage is that combustion CVD techniques do not necessarily require volatile precursors. If a solution of the precursor can be atomized/nebulized sufficiently, the atomized solution will behave essentially as a gas and can be transferred to the flame without requiring an appreciable vapor pressure from the precursor of interest. Also, since the flame temperature is quite high, thermally unstable precursors are not necessarily required.

In combustion CVD, if the flame is self-supporting (e.g., as with a propane-air mixture), the solvent need not be flammable. Thus, the inventor of the instant application has recognized that using water as a solvent would be advantageous for combustion CVD, as a water solvent would be easy to handle, environmentally friendly, and very inexpensive, especially when compared to organic solvents.

However, it is believed that only one study to-date has described the viable use of aqueous precursor solutions in connection with combustion CVD (see Davis, M. J. et al., "Growth of Thin Films of Molybdenum and Tungsten Oxides by Combustion CVD Using Aqueous Precursor Solutions." *Chemical Vapor Deposition*, vol. 10, no. 1 (2004), p. 29). In this study, molybdenum and tungsten oxides were deposited from the involatile inorganic salts ammonium molybdate and ammonium metatungstate, respectively, in aqueous solution. Coatings from about 20 nm up to 100 nm were grown, depending on the deposition conditions.

Based on this study, the inventor of the instant application has recognized the feasibility of depositing coatings of $TiO_2$ from aqueous precursor solutions. $TiO_2$ or other titanium oxide coatings provided by combustion deposition open up opportunities for low cost production of multilayer AR (MLAR) designs and low maintenance glass applications, comparable to more conventional photocatalytic and superhydrophilic coatings. Depositing coatings of $TiO_2$ (or other titanium oxide forms) from aqueous precursor solutions, for example, advantageously would be easy to handle, environmentally friendly, and very inexpensive.

Thus, it will be appreciated that it would be advantageous to identify and provide an aqueous based precursor system for the deposition of coatings (e.g., $TiO_2$ coatings) via combustion deposition.

In certain example embodiments of this invention, a method of applying a coating to a glass substrate using combustion deposition is provided. A glass substrate having at least one surface to be coated is provided. A reagent and a carrier medium are selected, and the reagent and the carrier medium are mixed together to form a reagent mixture. The reagent is selected such that at least a portion of the reagent forms the coating. An aqueous based precursor to be combusted with the reagent mixture is introduced. Using at least one flame, at least a portion of the reagent mixture and the aqueous based precursor are combusted to form a combusted material. The combusted material comprises non-vaporized material. The glass substrate is provided in an area so that the glass substrate is heated sufficiently to allow the combusted material to form the coating, directly or indirectly, on the glass substrate.

In certain example embodiments of this invention, a method of applying a coating to a substrate using combustion deposition is provided. A substrate having at least one surface to be coated is provided. A reagent and a carrier medium are selected, and the reagent and the carrier medium are mixed together to form a reagent mixture. The reagent is selected such that at least a portion of the reagent forms the coating. An aqueous based precursor to be combusted with the reagent mixture is introduced. The aqueous based precursor is an organic salt of titanium. Using at least one flame, at least a portion of the reagent mixture and the aqueous based precursor are combusted to form a combusted material. The substrate is provided in an area so that the substrate is heated sufficiently to allow the combusted material to form the coating, directly or indirectly, on the substrate. The deposited coating is $TiO_2$.

In certain example embodiments of this invention, a method of applying multiple coatings to a substrate using combustion deposition is provided. A glass substrate having at least one surface to be coated is provided. There is formed a first reagent mixture including a first reagent selected so that at least a portion of the first reagent forms a first coating. There is formed a second reagent mixture including a second reagent selected so that at least a portion of the second reagent forms a second coating. At least one aqueous based precursor to be combusted is introduced. Using at least one flame, at least a portion of the first reagent mixture is combusted to form a first combusted material. The first combusted material comprises non-vaporized material. Using at least one flame, at least a portion of the second reagent mixture is combusted to form a second combusted material. The second combusted material comprises non-vaporized material. The substrate is provided in an area so that the substrate is heated sufficiently to allow the first combusted material and the second combusted material to form a first coating and a second coating, respectively, directly or indirectly, on the substrate.

BRIEF DESCRIPTION OF THE DRAWINGS

These and other features and advantages may be better and more completely understood by reference to the following detailed description of exemplary illustrative embodiments in conjunction with the drawings, of which:

FIG. 1a is a simplified view of a conventional apparatus used to carry out combustion chemical vapor deposition;

FIG. 1b is a simplified view of a conventional apparatus similar to that shown in FIG. 1a, but is configured for a non-turbulent flame;

DETAILED DESCRIPTION OF EXAMPLE EMBODIMENTS OF THE INVENTION

Figure 1C:
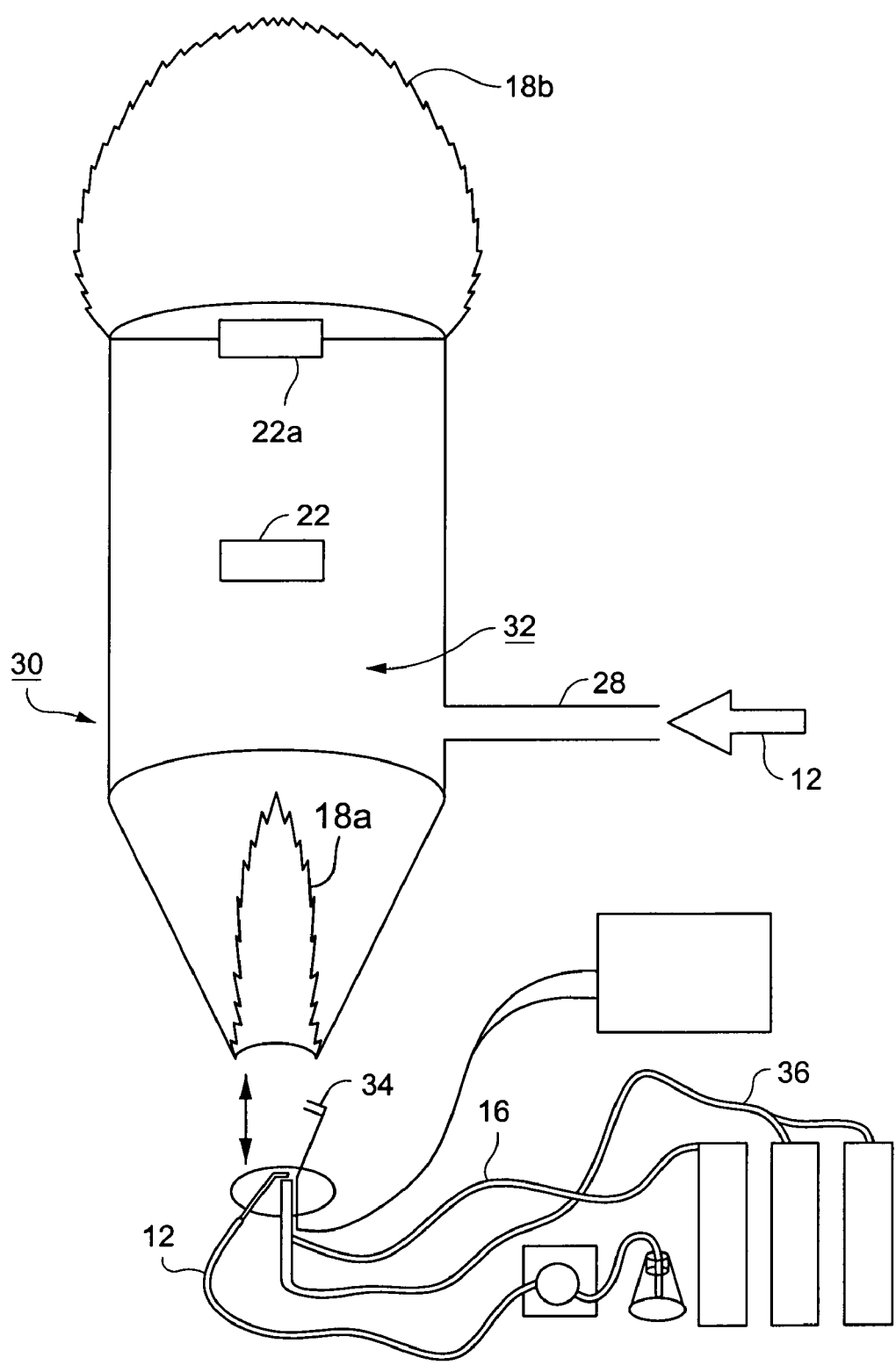
FIG. 1c is a simplified view of a conventional combustion chemical vapor deposition apparatus using a Smithell separator.

Certain example embodiments provide improvements to conventional combustion CVD techniques. For example, certain example embodiments use an aqueous based precursor system for the deposition of titanium dioxide (e.g., $TiO_2$ or other suitable stoichiometry) coatings via combustion deposition. Also, in contrast to conventional combustion CVD techniques, the combusted material may comprise non-vaporized material in certain example embodiments. Such techniques result in an inexpensive, easy to handle, and environmentally friendly method of generating titanium dioxide coatings. Furthermore, the deposited coatings may be of high refractive index and may possess photocatalytic and/or superhydrophilic properties. Thus, certain example embodiments are particularly useful in the production of, for example, multilayer AR (MLAR) designs and low maintenance glass applications.

Conventional Combustion CVD

Before describing the aqueous based precursor system of certain example embodiments, a description of conventional combustion CVD will now be provided by way of background and contrast. Conventional combustion CVD is known to involve vapor deposition of a film onto a substrate near or in a flame, which causes the reagents fed into the flame to chemically react. Flammable organic solvents containing elemental constituents of the desired coating in solution as dissolved reagents are sprayed through a nozzle and burned. Alternatively, vapor reagents are fed into the flame and burned. Likewise, non-flammable solvents can be used with a gas-fueled flame. An oxidant, such as oxygen, is provided at the nozzle to react with the solvent during burning. Upon burning, reagent species present in the flame chemically react and vaporize, and then deposit and form a coating on a substrate held in the combustion gases in or just beyond the flame's end. During the deposition of oxide coatings, oxygen is available from at least three possible sources including the oxidant gas, the surrounding gases, and the dissolved chemical reagents.

In standard combustion CVD, the environment required for CVD to occur is provided by the flame. The flame supplies the energy needed for CVD in the forms of the kinetic energy of the species present and radiation. This energy creates the appropriate thermal environment to form reactive species and coincidentally heats the substrate, thus providing the conditions for surface reactions, diffusion, nucleation, and growth to occur. When using combustible solutions, the solvent plays at least two roles in combustion CVD. First, the solvent conveys the coating reagents into the vicinity of the substrate where CVD occurs, thereby allowing the use of low cost soluble precursors. Uniform feed rates of any reagent stoichiometry can be produced easily by simply varying the reagents concentrations in solution and the solution flow rate. Second, combustion of the solvent produces the flame required for conventional combustion CVD.

In general, combustion CVD is performed under ambient conditions in the open atmosphere to produce a film on a substrate. The reagent, or chemically reactive compound, is dissolved or carried in a solvent, which typically in conventional combustion CVD is a liquid organic solvent, such as an alkene, alkide, or alcohol. The resulting solution is sprayed from a nozzle using oxygen-enriched air as the propellant gas and ignited. A substrate is maintained at or near the flame's end. Flame blow-off may be reduced (e.g., prevented) by use of a hot element such as a small pilot light. In conventional combustion CVD, the reactants vaporize in the flame and are deposited on the substrate as a film. Resulting films (e.g., coatings) show extensive preferred orientation in x-ray diffraction patterns, evidencing that CVD will occur by heterogeneous nucleation and result in a film having a preferred orientation.

Alternatively, depositions can be performed by feeding solution through a nebulizer, such as a needle bisecting a thin high velocity air stream forming a spray which is ignited and burned. In this manner, other materials may be deposited onto substrates. Different solvents and different metal-organic precursors may be used in various depositions. Other reactants and solvents are appropriate and will function in connection with conventional combustion CVD techniques, generally as long as a flame can be created which will vaporize the reactants.

The substrate may be located in a zone such that it is heated by the flame's radiant energy and the hot gases produced by the flame sufficiently to allow surface diffusion. This temperature zone is present from about the middle of the flame to some distance beyond the flame's end. The temperature of the flame can be controlled to some extent by varying the oxidant-to-fuel ratio as well as by adding non-reactive gases to the feed gas or non-combustible miscible liquids to the solution. The metal complexes may be vaporized and chemically changed into the desired state. For oxides, this will occur in the flame if sufficient oxygen is present. The high temperatures, radiant energy (e.g., infrared, ultraviolet, and other radiant energy), and plasma of the flame aid in the reactivity of precursors. Particle formation may be suppressed by maintaining a low concentration of solutes, and by reducing (e.g., minimizing) the distance, and therefore time, between where the reagents react and where the substrate is located. Combining these different factors predicts the best CVD deposition zone to be in the proximity of the flame's end. If a solution is sprayed, droplets can strike a substrate located too far into the flame, possibly resulting in some spray pyrolysis characteristics in the resulting film. A mixture of CVD and spray pyrolysis may be desired in some films.

In general, as long as a flame is produced, conventional combustion CVD can occur, independent of the flame temperature, deposition zone pressure or temperature, or substrate surface temperature. The flame temperature generally is dependent on the type and quantity of reagent, solvent, fuel and oxidant used, and the substrate shape and material, and can be determined by one skilled in the art when presented with the particular reagent, solvent, fuel, oxidant, and other components and conditions for deposition. The preferred flame temperature for the preferred solutions and materials in conventional combustion CVD is between about 300° C. and 2800° C. As flames can exist over a wide pressure range, conventional combustion CVD can be accomplished at a pressure from about 10 torr to about 10,000 torr. Likewise, if a plasma is formed for depositing the coating, the temperature of the plasma can range from about 800° C. to about 10,000° C. The temperature of the substrate during the conventional combustion CVD process also can vary depending on the type of coating desired, the substrate material, and the flame characteristics. Generally, a substrate surface temperature of between about 100° C. and 2200° C. is preferred for conventional combustion CVD.

If the droplets actually contact the substrate, a mixed deposition technique of both CVD and spray pyrolysis may occur. As a droplet approaches the substrate, the outer surface of the droplet may be enriched in the solutes as the solvent was evaporated. The impacting drop should burn off of the substrate almost instantaneously, possibly cooling and then heating this area, leaving a ring-shaped spot. The ring may be thicker on the outside as more of the solutes would have been concentrated there. This type of deposition might help increase the deposition efficiency, while maintaining heterogeneous nucleation.

The deposition rate of the coating onto the substrate can vary widely depending on, among other factors, the coating quality, the coating thickness, the reagent, the substrate material, and the flame characteristics. For example, longer coating times may result in thicker coatings, assuming a relatively constant feed flow rate to the flame, less porous coatings, assuming a relatively lower feed flow rate to the flame, or more porous coatings, assuming a relatively greater feed flow rate to the flame. Likewise, if a higher quality coating is desired, a longer coating time at a lower feed flow rate may be used, while a gross coating can be produced relatively quickly using a greater feed flow rate. Conventional deposition rates associated with conventional combustion CVD may range from about 0.1 µm/hr to about 1000 µm/hr.

Referring now more particularly to the drawings, FIG. 1a is a simplified view of an apparatus 10 used to carry out conventional combustion chemical vapor deposition, which produces a turbulent flame with no appreciable separate inner and outer flames. A solvent-reagent mixture, which can be flammable or non-flammable solvents mixed with liquid, vaporous, or gaseous reagents, but typically is a solvent-reagent solution 12, is supplied to a torch 14 or other flame-producing apparatus. The solvent-reagent solution 12 is ignited in the presence of an oxidant 16, resulting in a flame 18. The solvent-reagent solution 12 may be ignited using any conventional method, and the flame 18 may be maintained, if necessary, by a device such as a conventional pilot light (not shown) or a sparker 34 (shown in FIG. 1c). In conventional combustion CVD, as the solvent-reagent solution 12 burns, the reagent vaporizes and leaves the flame 18 along with other hot gases 20 and combustion products. The apparatus 10 shown in FIG. 1b is similar to the apparatus 10 shown in FIG. 1a, but is configured for a non-turbulent flame, suitable for gas reagents and non-flammable carrier solutions. Flame 18 produced by torch 14 of FIG. 1b typically has the general flame characteristics of an inner flame 18a defining the reducing region where the majority of the oxidizing gas supplied with the reagent burns and an outer flame 18b defining the oxidizing region where the excess fuel oxidizes with any oxidizing gas in the atmosphere.

FIG. 1c is a simplified view of an apparatus using a Smithell separator 30 for conventional combustion CVD. The substrate 22 can be placed within the reducing region 32 of the Smithell separator 30 between the inner flame 18a and the outer flame 18b. Alternatively, the substrate 22a can be placed at the exit of the Smithell separator 30, yet still within the reducing region 32, such that substrates 22a larger than the cross-section of the Smithell separator 30 may be coated by moving either the substrate or the apparatus. Additional or other reagents can be supplied to the reducing region 32 of the Smithell separator via supply means 28. The apparatus shown in FIG. 1c has a controlled atmosphere in which, by controlling the fuel gas to oxidizing gas ratio, a reducing region (atmosphere) 32 can be created beyond the inner flame 18a. This apparatus allows for the deposition of materials that require a reducing environment to form quality coatings. Sparker 34 helps maintain the flame. A fuel 36, such as hydrogen gas $H_2$, $NH_3$, or other gas is added to the solvent-reagent solution 12 before ignition.

The substrate 22 to be coated is located proximate to flame 18, typically at or near the end 24 of flame 18, but within the hot gases 20 region. The surface 26 of the substrate 22 that is to be coated is placed facing the flame 18 in some manner, either tangentially as shown in FIG. 1a or obliquely as shown in FIG. 1b, or at any angle to the flame 18 such that the hot gases 20 containing the reagent will contact the surface 26 to be coated. However, it is understood that combustion CVD can occur on the side of the substrate away from the flame.

In operation, the chemically reactive compound, or reagent, is mixed with a flammable liquid carrier. The reagent may be an organic or inorganic compound that will react in the flame's environment, and the carrier may be a solvent that is an organic compound, although any reagents that can form a coating and any carriers may be used. The reagent may be dissolved in the carrier as a liquid solvent-reagent solution so as to spray better in the torch 14 and, consequently, flame better, also resulting in a more homogeneous reagent vapor and subsequent coating on the substrate 22. The reagent-carrier mixture is referred to herein generally as the solvent-reagent solution 12.

In conventional combustion CVD, after the liquid reagent is vaporized by the heat of combustion of the oxidant 16 and the solvent, the reagent vapors leave the flame 18 along with other hot gases 20. The substrate 22 to be coated is placed in a position where the reagent vapors will contact the surface 26 of the substrate 22 to be coated. As the reagent vapors contact the surface 26 to be coated, the reagent vapors condense and form a coating.

The substrate may be located in a zone such that it is heated sufficiently by the flame, or heat of combustion of the solvent-reagent solution 12 and oxidant 16, to allow surface diffusion of the coating along the substrate 22. This temperature is present in the flame 18 to some distance beyond the flame's end 24. The metal complexes of the reagent may be chemically changed to the final state. For oxides, this would occur in a zone between the middle of the flame 18 and the flame's end 24. In conventional combustion CVD, the material to be deposited must be in the vapor phase, and cannot be allowed to grow too large (e.g., become stable particles). In conventional combustion CVD, this can be controlled by maintaining a low concentration of solutes, and by reducing (e.g., minimizing) the distance between the surface 26 to be coated and where the oxidation occurs.

A plasma torch also can be used in a manner similar to a flame to achieve the same combustion CVD results. Reagents are sprayed through a plasma torch and deposited onto the substrate. The reagents and other matter fed through the plasma torch are heated and, in turn, heat the substrate surface, much like the flame and hot gases heat the substrate surface in the flame embodiment. Both reacting and/or inert gases can be fed into the plasma torch, resulting in suitable conditions for both CVD and conventional combustion CVD. In plasma torch combustion CVD, a lower plasma temperature can be used, compared to conventional plasma spraying, as only enough heat is required to chemically react the reagents; the reactions occur at much lower temperatures than that needed to melt the resulting materials as is required with conventional plasma spraying. Such lower temperatures allow the use of less expensive, safer, and more mobile equipment, and the resulting film quality is comparable to other CVD methods.

Combustion Deposition Using Aqueous Based Precursor Example Embodiments

As noted above, certain example embodiments provide improvements to these conventional combustion CVD techniques. In particular, certain example embodiments provide an aqueous based precursor system for the deposition of titanium dioxide coatings via combustion deposition. The precursor system of certain example embodiments is an aqueous based organic salt. One particular salt identified as an advantageous route to titanium dioxide coatings via combustion deposition is of titanium and, more particularly, is titanium (IV) bis(ammonium lactate)dihydroxide (aq), an oxalic acid salt of titanium (e.g., potassium titanyl oxalate ($K_2TiO(C_2O_4)_2 \cdot 2\ H_2O$), $Ti_2(C_2O_4)_3 \cdot 10\ H_2O$, etc.), a water soluble salt of titanium acetate and titanium citrate, etc. Using the precursor system of certain example embodiments in conjunction with combustion deposition systems, an inexpensive, easy to handle, and environmentally friendly technique for generating $TiO_2$ (or other suitable stoichiometry) coatings may be realized. For example, the use of the example organic salts identified herein in connection with certain example embodiments reduces the production of corrosive elements (e.g., $NO_x$ and $SO_x$ byproducts which, in turn, produce nitric and/or sulfuric acids) that result from the inorganic salts typically used with conventional combustion CVD techniques, thereby also reducing the need for extra safety measures, special corrosive-resistant equipment, additional disposal routines, etc.

Unlike conventional combustion CVD techniques, the material is at least partially non-vaporized when it reaches the substrate. That is, the combusted material comprises at least some non-vaporized material, at least when it reaches the substrate. This may be accomplished in a system according to certain example embodiments where a substrate (e.g., a glass substrate) is at least initially heated to a temperature of about 60° C. to about 100° C. and a flame is provided at a temperature of about 1200-1600K. Experiments have shown that a flame temperature of about 1400-1600K are still more preferable, but the temperature may be adjusted somewhat, of course, based on the combustion conditions and materials used. This temperature range has been found to be advantageous, despite the fact that the fuels of certain example embodiments are mixed in an idealized air/propane ratio of 22.5, which suggests a flame temperature of about 2200K. Thus, it will be appreciated that in certain example embodiments the flame and/or substrate temperatures preferably are kept below those that would completely vaporize the material.

Moreover, although there may be some vapor pressure associated with the material in some implementations, certain example embodiments will maintain the material in an at least partially solid state. Keeping the material in the at least partially solid state may be accomplished by, for example, controlling the concentration and/or droplet size. With respect to the latter, it is possible in certain example embodiments to nebulize the material and/or render it an aerosol so as to make the material behave as if it were a vapor even though the combusted material is, in fact, at least partially (and sometimes substantially) non-vaporized.

Details for such an example atomization process involve creating a system capable of producing an average droplet size of about 3 µm, with substantially all droplets falling within the range of about 1 to 5 µm. This helps to ensure maximum precursor delivery through the burner to the flame and to reduce any condensation or deposition inside the burner head. As will be appreciated by those skilled in the art, this may require changes to the delivery system injector (e.g., so that an atomizer is configured to carry the appropriately atomized precursor through the flame) and/or possible customization of the burner.

The deposited coatings of certain example embodiments, practically speaking, may range from about 5 nm to a few hundred nm thick, depending on the intended application. In most applications including, for example, multilayer AR coatings, it is desirable to dispose $TiO_2$ coatings of about 10-50 nm in thickness. Additionally, it will be appreciated by one skilled in the art that multilayer AR coatings include stacks of alternating layers, generally of $SiO_2$ and $TiO_2$, and that multiple thicknesses may be used in within a stack.

The deposited $TiO_2$ coatings of certain example embodiments also may be of high refractive index and may possess photocatalytic and/or super-hydrophilic properties. More particularly, the refractive index may be at least about 2.2 and up to about 2.6, depending on the phase of $TiO_2$.

Figure 2:
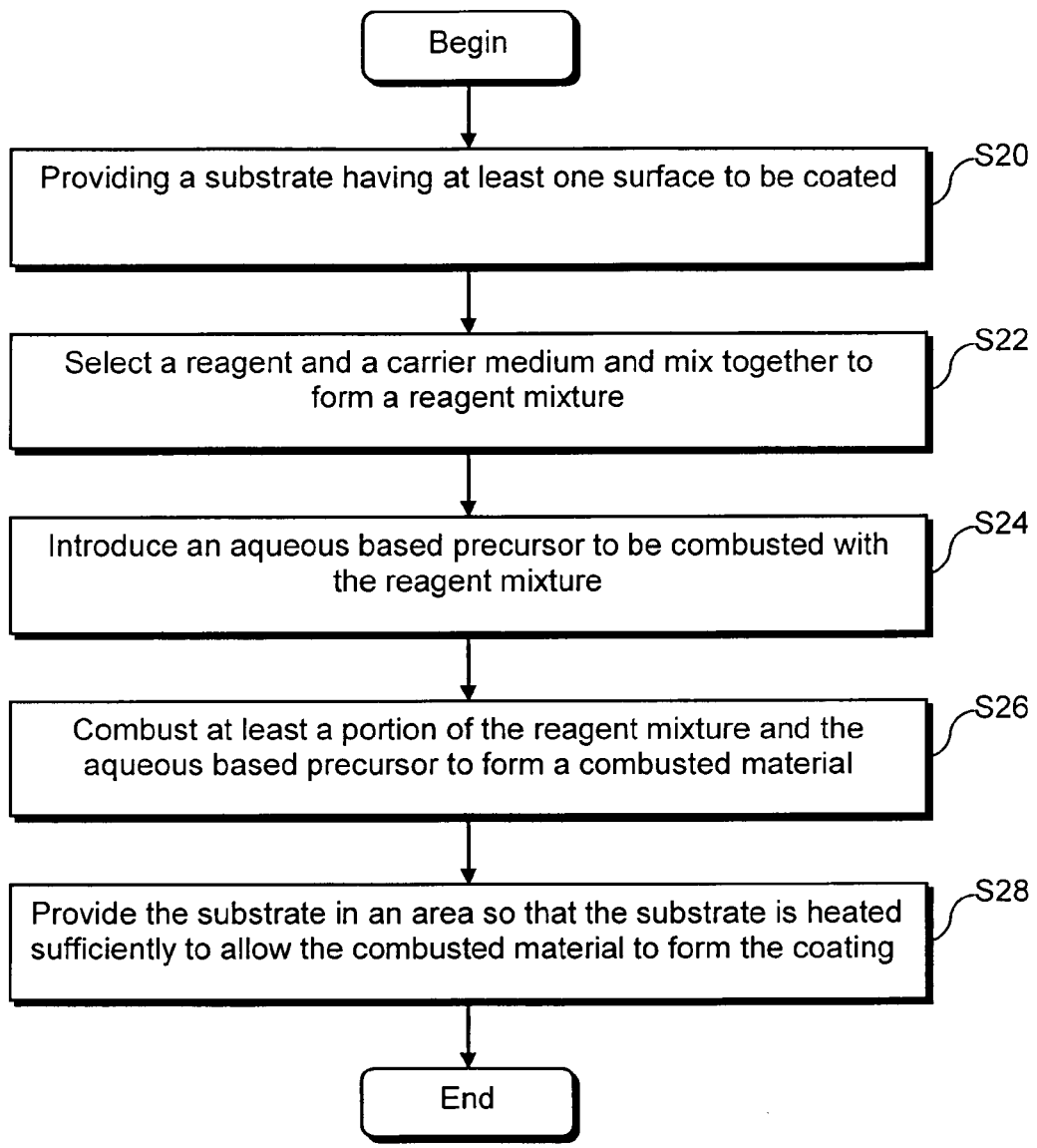
FIG. 2 is an illustrative flowchart illustrating a process for applying a coating to a glass substrate using combustion deposition using an aqueous precursor solution in accordance with an example embodiment.

FIG. 2 is an illustrative flowchart illustrating a process for applying a coating to a glass substrate using combustion deposition using an aqueous precursor solution in accordance with an example embodiment. In step S20, a substrate (e.g., a glass substrate) having at least one surface to be coated is provided. A reagent and a carrier medium are selected and mixed together to form a reagent mixture in step S22. The reagent is selected so that at least a portion of the reagent forms the coating. An aqueous based precursor to be combusted with the reagent mixture is introduced in step S24. In step S26, at least a portion of the reagent mixture and the aqueous based precursor are combusted, thereby forming a combusted material. The combusted material comprises non-vaporized material. The combustion may be performed using at least one flame. In step S28, the substrate is provided in an area so that the substrate is heated sufficiently to allow the combusted material to form the coating on the substrate. The coating may be formed either directly or indirectly on the substrate.

Optionally, multiple coatings may be applied to a substrate using combustion deposition. In such embodiments, multiple reagent mixtures and/or precursors may be combusted. Furthermore, multiple types of non-vaporized combusted material may be used to form the multiples coatings.

Figure 3:
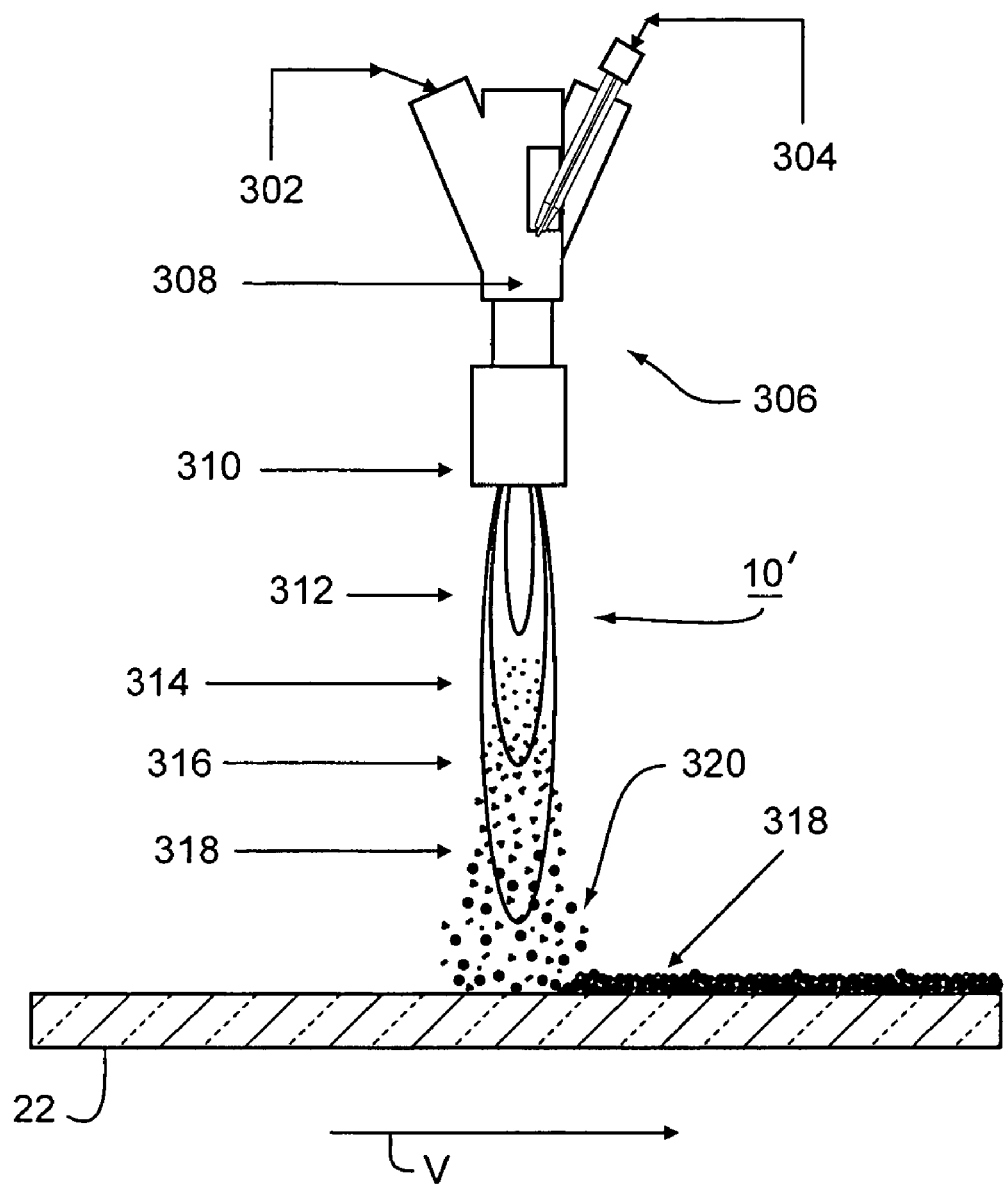
FIG. 3 is a simplified view of an improved apparatus used to carry out flame deposition in accordance with an example embodiment.

FIG. 3 is a simplified view of an improved apparatus 10' used to carry out flame deposition in accordance with an example embodiment. A combustion gas 302 (e.g., a propane air combustion gas) is fed into the apparatus 10', as is a suitable aqueous based precursor 304 (e.g., via insertion mechanism 306). Precursor nebulization (308) and at least partial precursor evaporation (310) occurs within the apparatus 10'. There flame 18' may be thought of as including multiple areas. Such areas correspond to chemical reaction area 312 (e.g., where reduction, oxidation, and/or the like may occur), nucleation area 314, coagulation area 316 and agglomeration area 318. Of course, it will be appreciated that such example areas are not discrete and that one or more of the above processes may begin, continue, and/or end throughout one or more of the other areas.

Particulate matter 320 begins forming within the flame 18' and moves downward towards the surface 26 of the substrate 22 to be coated, resulting in film growth 322. As will be appreciated from FIG. 3, the combusted material comprises non-vaporized material (e.g., particulate matter), which is also at least partially in particulate form when coming into contact with the substrate 22. To deposit the coating, the substrate 22 may be moved (e.g., in the direction of velocity vector V). Of course, it will be appreciated that the present invention is not limited to any particular velocity vector, and that other example embodiments may involve the use of multiple apparatuses 10' for coating different portions of the substrate 22, may involve moving a single apparatus 10' while keeping the substrate in a fixed position, etc.

It will be appreciated that although certain example embodiments have been described in connection with organic salts, the present invention is not limited thereto. For example, inorganic salts such as $Ti(NO_3)_4$ and $Ti(SO_4)_2$ can been used in the flame synthesis and/or flame deposition of $TiO_2$ coatings in connection with certain example embodiments. However, the byproducts of such reactions are very corrosive. Thus, if the precursors are being passed directly into the burner, the burner may be made of a corrosion resistant materials such as inconel alloys. In contrast to the use of such inorganic salts, using salts of organic acids mainly produces $CO_2$ and $H_2O$.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coating on a glass substrate using combustion deposition, the method comprising:
   providing a glass substrate having at least one surface to be coated;
   selecting a reagent and a carrier medium and mixing together the reagent and the carrier medium to form a reagent mixture, the reagent being selected such that at least a portion of the reagent is used in forming the coating;
   introducing an aqueous based precursor to be combusted with the reagent mixture;
   combusting, using at least one flame, at least a portion of the reagent mixture and the aqueous based precursor to form a combusted material, the combusted material comprising non-vaporized material; and
   providing the glass substrate in an area so that the glass substrate is heated sufficiently to allow the combusted material to form the coating, directly or indirectly, on the glass substrate,
   wherein the coating comprises at least some of the non-vaporized material from the combusted material.

2. The method of claim 1, wherein the precursor is an organic salt of titanium.

3. The method of claim 2, wherein the precursor is titanium (IV) bis(ammonium lactate)dihydroxide (aq).

4. The method of claim 1, wherein the precursor is an oxalic acid salt of titanium.

5. The method of claim 4, wherein the precursor is potassium titanyl oxalate or $Ti_2(C_2O_4)_3 \cdot 10\,H_2O$.

6. The method of claim 1, wherein the precursor is a water soluble salt of titanium acetate and/or titanium citrate.

7. The method of claim 1, wherein the coating comprises an oxide of titanium.

8. The method of claim 1, wherein the coating is about 10-50 nm thick.

9. The method of claim 1, further comprising providing the at least one flame used in the combusting at a temperature of from about 1400-1600K.

10. The method of claim 1, further comprising providing the substrate at least initially at a temperature of from about 60-100° C.

11. The method of claim 1, further comprising providing the at least one flame used in the combusting at a temperature of about 1400-1600K and providing the substrate at least initially at a temperature of about 60-100° C.

12. The method of claim 1, wherein the combusting includes using a fuel comprising a mixture of oxygen and propane.

13. The method of claim 1, wherein the precursor is introduced as an aerosol via an atomizer.

14. The method of claim 13, further comprising providing the material in droplet form, the droplets being within the range of about 1 to 5 μm.

15. The method of claim 13, further comprising providing the material in droplet form, the average droplet size being about 3 μm.

16. The method of claim 1, further comprising depositing at least additional coating via flame pyrolysis, the additional coating being different from the coating.

17. The method of claim 1, further comprising depositing alternating layers of $SiO_2$ and $TiO_2$ so as to form a multilayer AR coating on the glass substrate.

18. A method of applying a coating to a substrate using combustion deposition, the method comprising:
   providing a substrate having at least one surface to be coated;
   selecting a reagent and a carrier medium and mixing together the reagent and the carrier medium to form a reagent mixture, the reagent being selected such that at least a portion of the reagent forms the coating;
   introducing an aqueous based precursor to be combusted with the reagent mixture, the aqueous based precursor being an organic salt of titanium;
   combusting, using at least one flame, at least a portion of the reagent mixture and the aqueous based precursor to form a combusted material, the combusted material comprising non-vaporized material; and
   providing the substrate in an area so that the substrate is heated sufficiently to allow the combusted material to form the coating, directly or indirectly, on the substrate,
   wherein the deposited coating is titanium oxide inclusive and comprises at least some of the non-vaporized material from the combusted material.

19. The method of claim 18, wherein the substrate is a glass substrate, and the coating comprises $TiO_2$.

20. The method of claim 18, wherein the aqueous based precursor is titanium (IV) bis(ammonium lactate)dihydroxide (aq).

21. The method of claim 18, wherein the precursor is an oxalic acid salt of titanium.

22. The method of claim 21, wherein the precursor is potassium titanyl oxalate or $Ti_2(C_2O_4)_3 \cdot 10\,H_2O$.

23. The method of claim 18, wherein the precursor is a water soluble salt of titanium acetate and/or titanium citrate.

24. A method of applying multiple coatings to a substrate using combustion deposition, the method comprising:
- providing a glass substrate having at least one surface to be coated;
- forming a first reagent mixture including a first reagent selected so that at least a portion of the first reagent forms a first coating;
- forming a second reagent mixture including a second reagent selected so that at least a portion of the second reagent forms a second coating;
- introducing at least one aqueous based precursor to be combusted;
- combusting, using at least one flame, at least a portion of the first reagent mixture to form a first combusted material, the first combusted material comprising non-vaporized material;
- combusting, using at least one flame, at least a portion of the second reagent mixture to form a second combusted material, the second combusted material comprising non-vaporized material; and
- providing the substrate in an area so that the substrate is heated sufficiently to allow the first combusted material and the second combusted material to form a first coating and a second coating, respectively, directly or indirectly, on the substrate,
- wherein the first coating comprises at least some of the non-vaporized material from the first combusted material, and the second coating comprises at least some of the non-vaporized material from the second combusted material.

25. The method of claim 18, wherein the substrate is a glass substrate.

26. The method of claim 18, further comprising depositing alternating coatings to form a multilayer AR coating.

* * * * *